Jan. 27, 1970 D. E. INMAN 3,492,537

MODULAR INTERCONNECTION SYSTEM

Filed Dec. 11, 1967 2 Sheets-Sheet 1

Inventor
Darwin E. Inman
By Francis W. Crotty
Attorney

Jan. 27, 1970 D. E. INMAN 3,492,537

MODULAR INTERCONNECTION SYSTEM

Filed Dec. 11, 1967 2 Sheets-Sheet 2

Inventor
Darwin E. Inman
By Francis W. Crotty
Attorney

United States Patent Office 3,492,537
Patented Jan. 27, 1970

3,492,537

MODULAR INTERCONNECTION SYSTEM

Darwin E. Inman, Highland Park, Ill., assignor to Zenith Radio Corporation, Chicago, Ill., a corporation of Delaware Filed Dec. 11, 1967, Ser. No. 689,553
Int. Cl. H05k 7/12
U.S. Cl. 317—101 9 Claims

ABSTRACT OF THE DISCLOSURE

A television receiver has a chassis on which certain components, such as the power transformer, are directly supported while other components including resistors, capacitors, transistors and the like, are supported upon a board which also establishes a desired pattern of connections. The board has an insulating base on which there are parallel rows of conductive segments and holes extending through these segments, and the board accepts the terminal leads of components which are affixed to the conductive segments by wave soldering. At each end of the board there are a plurality of socket terminals, each being connected with an adjacent one of the conductive segments. In order to connect the board into the circuity of the chassis, the chassis carries two groups of insertion terminals which receive leads from the components supported directly upon the chassis. The two groups of insertion terminals have the same space separation and the same arrangement as the socket terminals of the board so that the board may be removably secured in position on the chassis by mating its socket terminals with the insertion terminals. The terminal array permits securing the board in position on the chassis only when it has been presented with a particular orientation to complete a predetermined circuit pattern of the components supported by the board with those on the chassis.

BACKGROUND OF THE INVENTION

The present invention is directed to a modular type of interconnection system for arranging the various components of an electronic apparatus in a desired circuit configuration and, while having a wide field of application, it is especially attractive in the fabrication of wave signal receivers, such as television receivers, and will be described in that connection.

The use of so-called printed circuit in the construction of television receivers has in recent years become widespread even though the printed circuits of the prior art have exhibited notable deficiencies. Usually, they represent an integration of circuit components with conductive strips on an insulating base to define a desired circuit configuration. If the circuit components are, in fact, of the printed type or if the interconnecting conductors are tailored to a specific circuit configuration, such a printed circuit board is exceedingly inflexible and changes of either comoponent values or circuit layout are extremely difficult to achieve. The present invention, while featuring an interconnection board which supports and interconnects circuit components, is highly flexible both in respect of the component values and the circuit configurations that are established. Either may be modified with comparative ease.

Accordingly, it is an object of the invention to provide an improved modular type of interconnection system for the components of an electronic apparatus, such as a television receiver.

It is another object of the invention to provide such an interconnection system which exhibits a high degree of flexibility in respect of the components it may accommodate and the variety of circuit configurations it permits.

It is another specific object of the invention to provide such an interconnection system which lends itself especially well to machine fabrication of circuit modules.

It is still another specific object of the invention to provide a novel, flexible and economical modular type interconnection system for use in the manufacture of wave signal receivers.

SUMMARY OF THE INVENTION

A modular type of interconnection system constructed in accordance with the invention and utilized for assembling components of an electronic apparatus, such as a wave signal receiver, comprises a chassis on which some receiver components may be directly supported. Usually, large or heavy components such as transformers, loudspeakers and the like are mounted on the chassis. The system further comprises at least one but preferably a number of similar boards for supporting and interconnecting other components such as resistors, capacitors, inductors, transistors and the like. Each such board has a base of insulating material with length and width dimensions large compared with its thickness, and a plurality of conductive segments are aligned along an assigned one of a series of paths spaced from one another on one of the principal surfaces of the board, extending from one to the other end thereof. A series of apertures are provides in each such segment and the portion of the base covered thereby for the purpose of receiving the terminal leads of the components to be accommodated. At each end of the terminal board there is a plurality of socket type terminals aligned with at least one of the aforesaid paths and connected to the aligned adjacent conductive segment of its respective path. The interconnection system is completed by two groups of insertion terminals that are secured to the chassis for receiving the terminal leads of the circuit components that are supported by the chassis rather than by the particular interconnection board. The groups of insertion terminals have a separation and an arrangement on the chassis corresponding to that of the circuit terminals at the ends of the board for mating with the socket terminals carried by the board to removably secure the board in position on the chassis with the components supported by the board connected in a predetermined circuit pattern with the other components that are in electrical connection with the insertion terminals.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFFERED EMBODIMENT

Figures 1, 2:
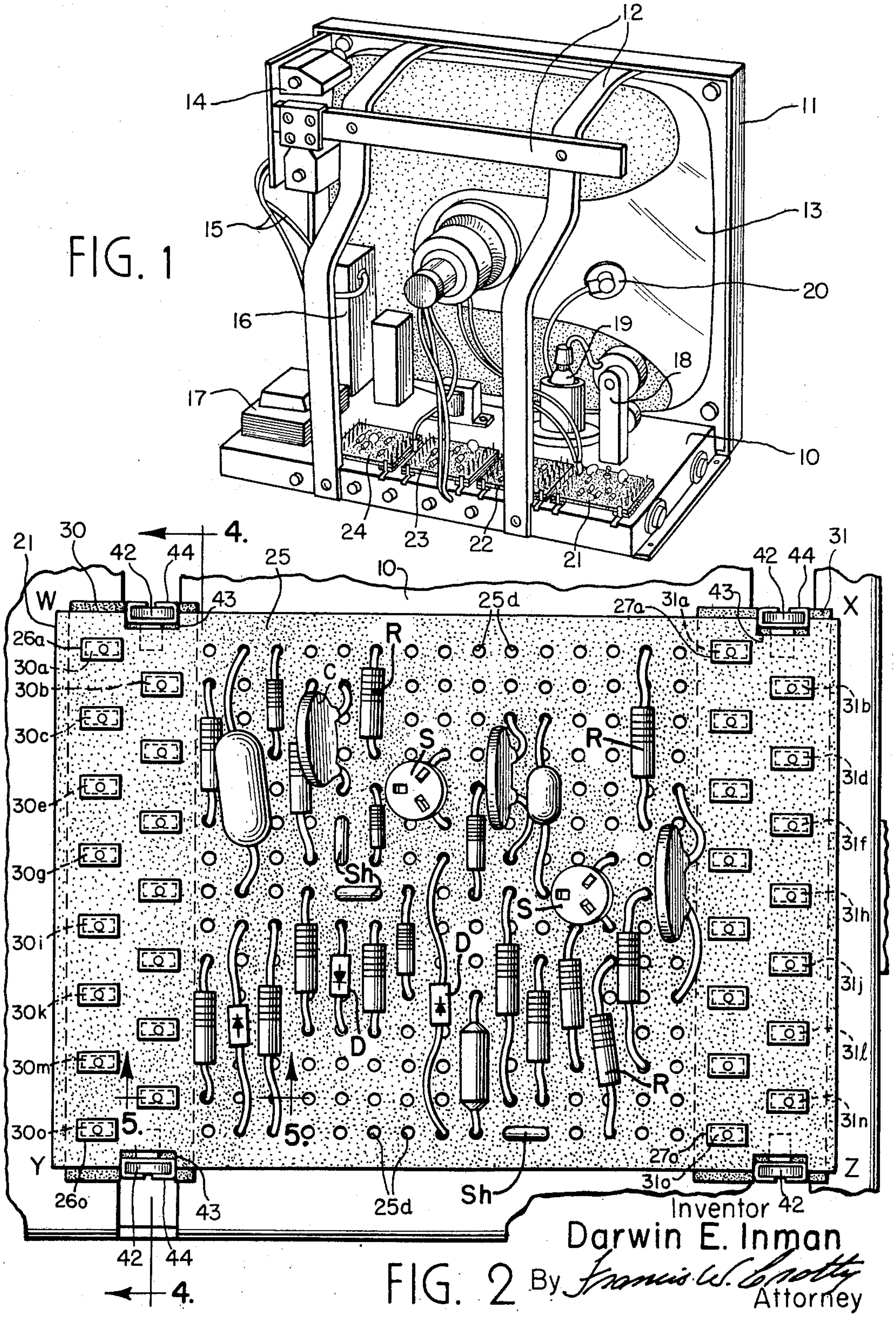
FIGURE 1 is a perspective view of a television receiver which utilizes a modular interconnection system in accordance with the invention and which, for convenience of illustration, is shown removed from its cabinet.
FIGURE 2 is a plan view of a segment of the top surface of the chassis of FIGURE 1, showing one side of a component-supporting an interconnection board included in the modular type interconnection system.

Referring now more particularly to FIGURE 1, the wave signal receiver there represented is a hybrid type, black and white television rectiver where the expression "hybrid" is used to designate the fact that the receiver employs tubes as well as transistors for its active devices. This receiver features a modular type of interconnection system in accordance with the present invention and comprises a chassis 10, an escutcheon 11 and structural straps 12 which rigidly support the escutcheon relative to the chassis. There is the usual picture tube 13 which, as shown, is of the monochrome or black and white variety and it, too, is affixed to escutcheon 11 by strapping (not shown) or through the well known technique of rim bonding which need not be described since it does not pertain to the invention. Channel selection is accomplished by means of a tuning system 14 suitably supported from the structural elements 12 and usually comprising both a VHF and a UHF tuner so that the receiver may respond to any of television channels assigned by the Federal Communications Commission. Conventionally, these tuners make use of both vacuum tubes and transistors although it is no moment to the invention what their mix may be or whether either is used to the exclusion of the other. Cables 15 lead from the tuner to an IF module 16 which is directly supported on chassis 10. Other large components are likewise supported on the chassis including, for example, a power transformer 17, a deflection transformer 18 and a high voltage rectifier 19 supplying high voltage potential to an anode terminal 20 of picture tube 13. There are, of course, a great many other components, both active and passive, that are required to constitute an operating receiver but their circuitry and functions are of no real consequence to the present invention which addresses itself to the manner in which certain of the components may be supported in functional relation with the remaining components of the receiver by means of the modular interconnection system. Suffice it here to say that a number of interconnection boards are utilized for individually accommodating certain of the circuit components and for effecting connections between these and the other components required of an operative receiver. The remainder of the description will be confined largely to such boards and the cooperating devices for effecting the circuit connections from these boards to other circuitry of the chassis.

More particularly, the receiver of FIGURE 1 is shown as having four interconnection boards 21–24, inclusive. Structurally, the boards are essentially identical and a description of one will make clear the structures of the others although it will be apparent that the specific components accommodated by one board and the circuit pattern of connections by that board may and usually will be specifically different from those of the remaining boards.

Figures 3, 4, 5:
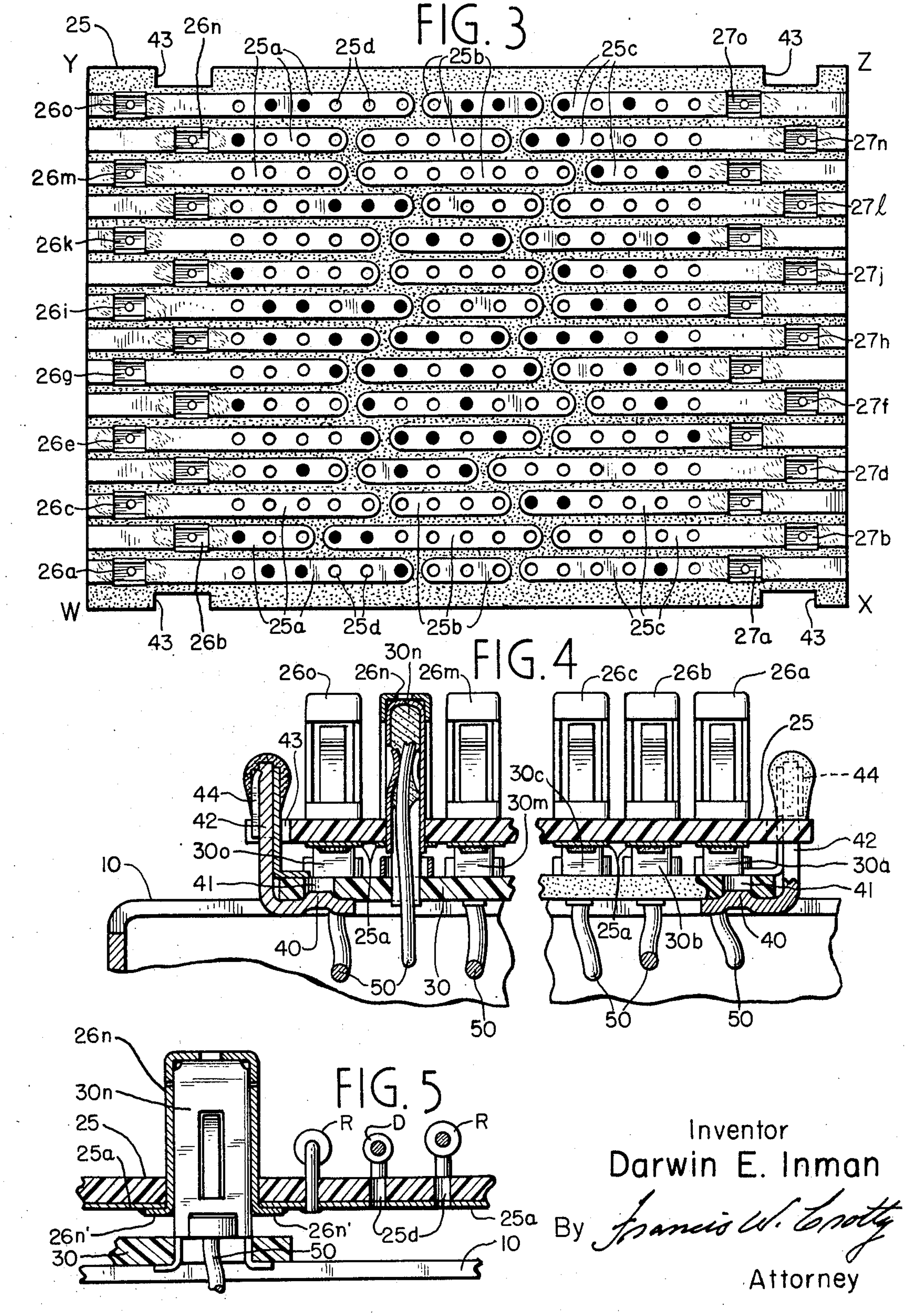
FIGURE 3 is a view of the obverse side of the same board.
FIGURES 4 and 5 are fragmentary cross sectional views taken along lines 4—4 and 5—5 of FIGURE 2 and representing the interconnections of socket terminals carried by the component-supporting board on the one hand and insertion terminals affixed to the chassis on the other.

Each such board, as shown in detail in FIGURES 2 and 3, has a base 25 of insulating material such as a phenolic resin available under the designation XXXP Bakelite. The base has length and width dimensions large compared with its thickness and is initially provided at each end with a series of terminal-receiving apertures to be discussed hereafter and a copper layer or cladding covers one face thereof. A resist is screened onto this conductive layer in accordance with a predetermined design so that by introducing base 35 into a chemical etching bath the exposed parts of the cladding are removed to develop a desired pattern of conductors on the surface of the board. It is desirable that the conductive pattern comprise a plurality of conductive segments aligned along an assigned one of series of paths spaced from one another on the face of the board and extending from one end thereof to the other. An especially useful conductor pattern is illustrated in FIGURE 3 in which it is clear that each path includes three conductive segments 25*a*, 25*b* and 25*c*; each segment being disposed along an assigned path which is parallel to the longitudinal axis of base 25. It will further be observed from FIGURE 3 that the relative lengths of the conductive segments in adjacent paths are selected to the end that the pattern of insulating areas that intervene consecutive segments along the several paths is staggered as viewed across the width of base 25. This is advantageous in that it minimizes the need of using bridging conductors which becomes necessary if the segments of each path are of the same length and present unbroken lines of insulation running transversely of base 25.

In order to facilitate mounting components on the interconnection board and completing circuit connections to such components each conductive segment and the portion of the base which it overlays is punched to present a series of apertures 25*d* for receiving the terminal leads of components to be supported on the interconnection board. Preferably, the apertures are uniformly spaced along each of the paths that the conductive segments define and, additionally, the center to center spacing of adjacent paths is the same as the spacing of apertures 25*d*. For the components currently in commercial use a spacing of 150 mils is exceedingly useful.

Of course, it is necessary to extend circuit connections to and from the components accommodated by the interconnection board and for that purpose at each of the ends thereof there is provided a plurality of socket type terminals 26*a*–26*o* at one end and 27*a*–27*o* at the other. The expression "socket type terminal" is used here to mean a conductive element having a hollow cylindrical portion that is dimensioned to snugly receive and make good electrical contact with an insertion terminal in much the same manner in which male and female plug and socket elements mate in completing electrical circuits. Each socket terminal is aligned with one of the paths defined by the conductive segments on base 25 and is conductively connected to the aligned adjacent conductive segment of its respective path. Socket terminals of the type preferred, such as that shown in cross section at 26*n* in FIGURE 4, are commercially available; one for example is produced by AMP, Incorporated of Harrisburg, Pa. under type designation 61243. Such a terminal is supplied in strip form and in order to accommodate it, base 25 has appropriately dimensioned apertures into which the socket may be inserted by a suitable insertion die set. Such a set would comprise a central member for directing the terminal into the aperture of base 25 and would have cooperating side dies for compressing the sides of the terminal to facilitate the insertion. After the terminal has been inserted and the dies retracted, the terminal which is made of resilient material, such as pretinned brass, tends to lock itself in place. It is, of course, desirable to provide the open end of each socket with horizontally extending flanges 26*n*′ that overlap and, during the insertion process, are forced against the conductive segment 25*a* or 27*a*, for example, with which it is aligned; see FIGURE 5. It is also desirable, for reasons to be stated hereafter, to have the width of the socket terminal slightly greater than the width of the conductive segments **25*a*–*b*–*c***.

As shown in FIGURE 3, terminals **26*a* to 26*o* are arrayed in two parallel rows transversely of base 25 and the same is true of terminals 27*a* to 27*o*. Additionally, the terminals at the both ends are asymmetrical with respect to the central transverse axis of the interconnection board which as will be explained hereafter, permits installing a given interconnection board on chassis 11** only when it has been presented with a particular orientation.

In illustrating the full flexibility of the interconnection board in FIGURES 2 and 3, it has been convenient to represent a socket terminal at both ends of each of the series of paths defined by the conductive segments carried on one face of base 25. Of course, in particular uses of the interconnection board, it may not always be necessary to bring input and output leads for connections to every such path and in that case, one or a number of the socket terminals may be omitted as the requirements of the installation permit. This will lead to obvious economies for interconnection boards constructed with specific circuit requirements to be met.

As stated above, there are four such interconnection boards 21–24 of generally the same construction utilized in completing the circuitry of the illustrative receiver of FIGURE 1. They are operatively connected with chassis 10 of that receiver by groups of insertion terminals, two such groups being provided for each board. As indicated in FIGURE 2, one group of terminals is carried by an insulated support 30 and the companion group is carried by a similar support 31. The terminals of support 30 designated **30*a* to 30*o* while those of the other support are designated 31*a* to 31*o*. The separation of these two groups of terminals on chassis 10 and the arrangement or array of insertion terminals within each group corresponds to that of the socket terminals at each end of the interconnection board to be connected with the particular two groups of insertion terminals. Because of the asymmetry of the socket arrangement described above, the assigned interconnection board must be presented in a particular orientation for the socket terminals thereof to mate with the insertion terminals as required to secure the board in position on chassis 10. In the drawing, the letters W–Z inclusive of FIGURE 2 are point designations of the chassis over which the correspondingly designated points of the interconnection board of FIGURE 3 are superposed in order to present the illustrative interconnection board of FIGURE 3 to terminal groups 30 and 31 so that the socket terminals of the board may be slipped over or mated with the insertion terminals on the chassis. The detail of FIGURE 5 shows insertion terminal 30*n* received within socket terminal 26*n***.

To simplify installing terminal strips 30 and 31, chassis 10 has a pair of locating stops 40 which appear in FIGURE 4. The stops of a given pair are spaced in the width direction of chassis 10 by an amount corresponding to the spaced separation of a pair of apertures 41 provided in insulating supports 30 and 31 to locate such supports on the chassis. It may be convenient to have aperture 41 at one end of strip 30 configured to correspond with stop 40 and have the opposite aperture in the form of a slot of sufficient width to accommodate the chassis stop while making allowance for dimensional variations. This type of stop and aperture arrangement permits locating terminal strips 30 and 31 quickly and conveniently on the chassis. It is also convenient to provide a pair of upstanding lugs 42 in close proximity to each of locating stops 40 and to recess each terminal strip at 43, as shown in FIGURE 4, to receive lug 42. An L-shaped clamp 44 having a socket termination at one end may be slipped over lug 42 as shown in the detail of FIGURE 4 and soldered in place to clamp terminal strip 30 securely on the chassis. Again, commercial forms of insertion terminals are readily available. One such grouping of insertion terminals mounted upon an insulating support strip is marketed by AMP, Incorporated under type designation 116–2030. It is specifically dimensioned to cooperate with the socket terminal identified above.

The use of the described interconnection boards for the modular construction of the receiver of FIGURE 1 will be apparent from the foregoing explanation. Since no particular concern is to be given to the details of the circuitry, the use will be reviewed only from the standpoint of arranging components on the interconnection boards and securing the boards in position on the chassis to complete circuit connections with other components, such as chassis supported components that are in circuit connection with the insertion terminals secured to the chassis.

As shown in FIGURE 2, the described interconnection board permits accommodating a large number of circuit components arranged with their axes parallel to the length or width dimension of base 25. By way of component identification, reference characters R, C, D and S identify resistors, capacitors, diodes and sockets, respectively. For the two terminal components, the terminal leads extend through each of a pair of apertures of base 25 and the portions which extend through the conductive segments on the obverse face of the base are soldered to the conductive strips through which the leads pass. In this fashion, a given component may be electrically connected to a pair of the conductive segments. A three terminal component, such as a socket for a transistor or even the transistor itself because it may be supported by its own leads, is handled in essentially the same way.

It will be clear from inspection of FIGURE 3 that the apertures selected determine the routing or circuit path including a given component. For the component array of FIGURE 2, the circuit connections are indicated by the filled in circles representing the apertures of the conductive segments in FIGURE 3. This figure also demonstrates that connections are made, for example, from the conductive segment connected with socket terminal **26*a* to certain components and, likewise, from socket terminal 27*a*** to other components. Clearly, the selection of these connections will establish the circuit of the interconnection board. While the need for bridging connectors is minimized with the construction under consideration, as explained above, such connectors may of course be used and in FIGURE 2 they are designated S*h*.

It is a simple matter to assign numerals to identify the rows of apertures on base 25 and assign letters to designate the columns of apertures so that the combination of a numeral and a letter will identify a specific aperture. This permits the circuit designation to be defined by particularization of apertures through which terminal leads are to be inserted and the insertion may be accomplished manually, or, since the array is an orderly one, it may be programmed for machine insertion.

In any event, having inserted the leads of components through the appropriate apertures of base 25, the interconnection board is subjected to a wave soldering process in which each terminal lead extending through base 25 is soldered to the contiguous conductive segment. Generally, the solder will adhere to all of the conductive segments although, if desired, it may be confined by applying a resist to such portions of the conductive segments on which a deposit of solder is not desired. As a practical matter, this step is seldom necessary and wave soldering may be relied upon to complete the connections of the component leads to the appropriately selected conductive segments of the interconnection board. It should be noted in passing that if the socket terminals carried by the board are slightly wider than the conductive segments, the solder will not tend to run into the wells of the socket terminals but if the conductive segments are wider than the terminals, there is a distinct possibility of solder running into the socket which is of course undesirable.

In the described fashion, the components are arrayed and are secured mechanically in appropriate circuit configuration on each of interconnection boards 21–24, inclusive. These interconnection boards are now in condition for installation on the chassis.

It will, of course, have been necessary to have previously installed the pairs 30, 31 of groups of insertion terminals on the chassis and to have threaded into appropriate ones of the insertion terminals the leads that are necessary to extend circuit connections to and from each such terminal. For example, as illustrated in FIGURE 4, leads 50 are inserted into the insertion terminals and after they have been inserted, they are secured mechanically and in good electrical connection with the insertion terminal by the known technique of dip soldering. Obviously, the leads admitted to the insertion terminals may extend from components secured to the chassis or they may be leads which extend the circuit of one group of insertion terminals to another or perhaps even connections between insertion terminals included within a given group, as the case may be. Having installed and prepared the groups of insertion terminals, interconnection boards 21–24 are individually presented in the proper orientation to their assigned pairs of insertion terminal groups to mate therewith and secure the interconnection board in position on the chassis with the components supported thereby connected in a circuit pattern with the components or connections previously made to the various insertion terminals. For the reasons stated above, each such interconnection pattern may be received by its groups of insertion terminals only in a particular orientation to assure that proper circuit configurations result.

In addition to the convenience of a specific designation of apertures on the interconnection board explained above, a key or code may be used to position each of interconnection boards 21–24, inclusive, on chassis 10. For example, the boards may have a color code and a matching color designation may be applied to the chassis so that a plant worker may know upon inspection the specific location of each such interconnection board on the chassis.

The described modular structure is most attractive for the fabrication of wave signal receivers or any other electronic apparatus requiring a large number of circuit components. Programming is indeed possible to the end that components are machine inserted and the convenience of changing the program makes clear the flexibility of the described system both in respect of the variety of circuit configurations it makes possible as well as the ease of changing component values.

Experience indicates that a convenient size for base 25 is 3.5 x 2.4 inches and the stock is 1/16 inch thick. With these dimensions, it is convenient to prepare a module sheet with overall dimensions of 12 x 21 inches, for example, accommodating 30 individual base elements which are yieldably held in an integrated sheet by scoring or reduced wall section so that the separate base elements may subsequently be conveniently severed for individual use. The module sheet, at the same time, simplifies processing a number of bases concurrently with respect to cladding, etching and punching. In other words, in addition to the flexibility of the described modular interconnection system a number of attractive economies are made possible through its use. A still further attractive feature is that the interconnection board with its components soldered in place may be readily machine tested before being installed on chassis 10. This greatly facilitates monitoring the production process.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A modular type of interconnection system for the components of an electronic apparatus comprising:
- a chassis;
- a component supporting and interconnecting board which has:
  - (a) a base of insulating material with length and width dimensions large compared with its thickness,
  - (a) a plurality of conductive segments aligned along an assigned one of a series of paths spaced from one another on one of the principal surfaces of said base and extending from one to the other end thereof,
  - (c) in each segment and the portion of said base covered thereby, a series of apertures for receiving the terminal leads of certain of said components,
  - (d) at each of said ends of said base a plurality of socket-type terminals aligned with at least certain ones of said paths, connected to the aligned adjacent conductive segment of its respective path and arranged asymmetrically with respect to the central transverse axis of said board;
- and two groups of insertion terminals secured to said chasis for receiving the terminal leads of others of said components, said groups of insertion terminals having a separation and arrangment on said chassis corresponding to that of said socket terminals at said ends of said board for mating with said socket terminals only when said board is presented with a particular orientation to removably secure said board in position on said chassis with the components supported thereby connected in a predetermined circuit pattern with said other components.

2. An interconnection system in accordance with claim 1 in which there are at least three of said conductive segments in each of said paths and in which the lengths and positions of said segments in said series of paths are selected to establish a pattern of insulating areas between said conductive segments which, as viewed across said surface of said board, is staggered.

3. An interconnection system in accordance with claim 2 in which said apertures have a uniform spacing along each of said paths.

4. An interconnection system in accordance with claim 3 in which the spacing of said paths from one another is approximately equal to the spacing of said apertures.

5. An interconnection system in accordance with claim 4 in which each of said conductive segments is a conductive coating on said base disposed parallel to the longitudinal axis of said board.

6. An interconnection system in accordance with claim 1 in which the successive ones of said socket terminals at each end of said board are alternately located in each of two parallel rows disposed transversely of said board.

7. An interconnection system in accordance with claim 1 in which said chassis has a pair of locating stops projecting from the surface portions thereof where each of said groups of insertion terminals is to be located and in which each such group is secured to an insulated support having locating apertures at each end thereof for receiving said stops to position its group of insertion terminals on said chassis.

8. An interconnection system in accordance with claim 7 in which said chassis also has a pair of upstanding lugs positioned close to said stops, respectively, and in which clamps are supported by said lugs to extend over said insulated support to clamp said support in position.

9. An interconnection system in accordance with claim 1 in which the width of said socket terminals exceeds the width of the conductive segments to which said terminals connect.

References Cited

UNITED STATES PATENTS

| | | | |
|---|---|---|---|
| 3,195,050 | 7/1965 | Bray. | |
| 3,237,282 | 3/1966 | Rieth. | |
| 3,263,303 | 8/1966 | Oates. | |
| 3,283,060 | 11/1966 | Wiese | 317—101 XR |

FOREIGN PATENTS

| | | |
|---|---|---|
| 1,493,471 | 7/1967 | France. |

ROBERT K. SCHAEFER, Primary Examiner

J. R. SCOTT, Assistant Examiner

U.S. Cl. X.R.

339—17